US008248802B2

(12) United States Patent
Wang et al.

(10) Patent No.: US 8,248,802 B2
(45) Date of Patent: Aug. 21, 2012

(54) BACKBOARD ASSEMBLY AND ELECTRONIC DEVICE HAVING THE SAME

(75) Inventors: Jin Wang, Shenzhen (CN); Jin-Song Feng, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, New Taipei (TW)

( * ) Notice: Subject to any disclaimer, the term of this patent is extended or adjusted under 35 U.S.C. 154(b) by 340 days.

(21) Appl. No.: 12/581,179

(22) Filed: Oct. 19, 2009

(65) Prior Publication Data

US 2011/0061918 A1   Mar. 17, 2011

(30) Foreign Application Priority Data

Sep. 16, 2009   (CN) .......................... 2009 1 0307094

(51) Int. Cl.
*H05K 7/20* (2006.01)
*H05K 1/11* (2006.01)

(52) U.S. Cl. ........ 361/702; 361/704; 361/709; 361/710; 361/713; 361/803

(58) Field of Classification Search .......... 361/700–704, 361/709, 710, 788, 803, 713
See application file for complete search history.

(56) References Cited

U.S. PATENT DOCUMENTS

| 5,662,163 | A  | * | 9/1997  | Mira .............................. 165/80.3 |
| 6,765,793 | B2 | * | 7/2004  | Kehret et al. ................... 361/690 |
| 6,930,884 | B2 | * | 8/2005  | Cromwell et al. ............. 361/710 |
| 7,142,430 | B2 | * | 11/2006 | Lee et al. ....................... 361/719 |
| 7,292,447 | B2 | * | 11/2007 | Xia et al. ....................... 361/719 |
| 2005/0029652 | A1 | * | 2/2005  | Cuff et al. ..................... 257/712 |
| 2006/0227509 | A1 | * | 10/2006 | Yang et al. ..................... 361/704 |
| 2007/0121298 | A1 | * | 5/2007  | Zhao et al. .................... 361/710 |
| 2008/0009152 | A1 | * | 1/2008  | Colbert et al. ................... 439/73 |
| 2009/0056918 | A1 | * | 3/2009  | Li et al. ..................... 165/104.33 |

* cited by examiner

*Primary Examiner* — Timothy Thompson
*Assistant Examiner* — Sherman Ng
(74) *Attorney, Agent, or Firm* — Altis Law Group, Inc.

(57) ABSTRACT

A backboard assembly includes a back plate, an electrically insulative sheet and a connection element. The connection element comprises a plurality of first engaging structures on a first side thereof to engage with the back plate and a plurality of second engaging structures on a second side opposing to the first side to engage with the electrically insulative sheet.

9 Claims, 7 Drawing Sheets

BACKBOARD ASSEMBLY AND ELECTRONIC DEVICE HAVING THE SAME

BACKGROUND

1. Technical Field

The disclosure relates to a backboard assembly capable of being conveniently assembled to and dissembled from a printed circuit board, and an electronic device having such a backboard assembly.

2. Description of Related Art

Among an endless variety of electronic devices, one kind of electronic device comprises a printed circuit board, an electronic element mounted on a top surface of the printed circuit board, a heat sink, and a backboard. The heat sink defines a plurality of first through holes, the printed circuit board defines a plurality of second through holes in vertical alignment with the first through holes, respectively, and the backboard defines a plurality of third through holes in vertical alignment with the corresponding first and second through holes, respectively. Fastening elements, such as bolts, are sequentially extended through the first through holes of the heat sink and the second through holes of the printed circuit board, and are screwed into the third through holes of the backboard, thereby holding the heat sink, the printed circuit board and the backboard together. As a result, the heat sink can tightly thermally contact the electronic element mounted on the printed circuit board to dissipate heat generated by the electronic element.

Before assembling the heat sink, the printed circuit board and the backboard together, the backboard is pre-assembled to a bottom surface of the printed circuit board. The backboard generally comprises a metallic back plate and an electrically insulative sheet. To pre-assemble the backboard to the printed circuit board, two double-sided adhesives are respectively applied to two opposite surfaces of the electrically insulative sheet. Then the metallic back plate and the printed circuit board are respectively attached to the two opposite surfaces of the electrically insulative sheet, whereby the backboard is attached to the printed circuit board via the electrically insulative sheet.

To facilitate transport of the assembly of the heat sink, the printed circuit board and the backboard, this assembly should be disassembled. However, the printed circuit board and the backboard cannot be easily separated because of the double-sided adhesives applied therebetween.

What is needed, therefore, is a backboard assembly capable of being conveniently assembled to and disassembled from a printed circuit board, and an electronic device having such a backboard assembly and printed circuit board.

BRIEF DESCRIPTION OF THE DRAWINGS

Many aspects of the present apparatus can be better understood with reference to the following drawings. The components in the drawings are not necessarily drawn to scale, the emphasis instead being placed upon clearly illustrating the principles of the present apparatus. Moreover, in the drawings, like reference numerals designate corresponding parts throughout the several views.

DETAILED DESCRIPTION

Figure 1:
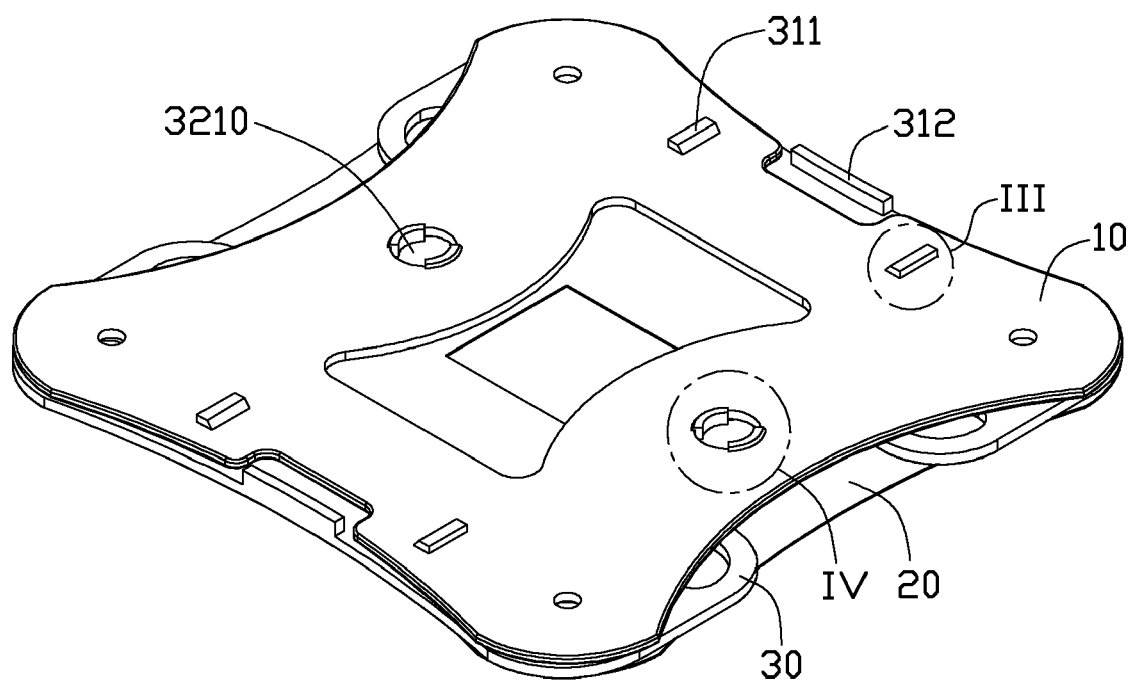
FIG. 1 is an assembled view of an electronic device in accordance with an exemplary embodiment of the disclosure.
Figure 2:
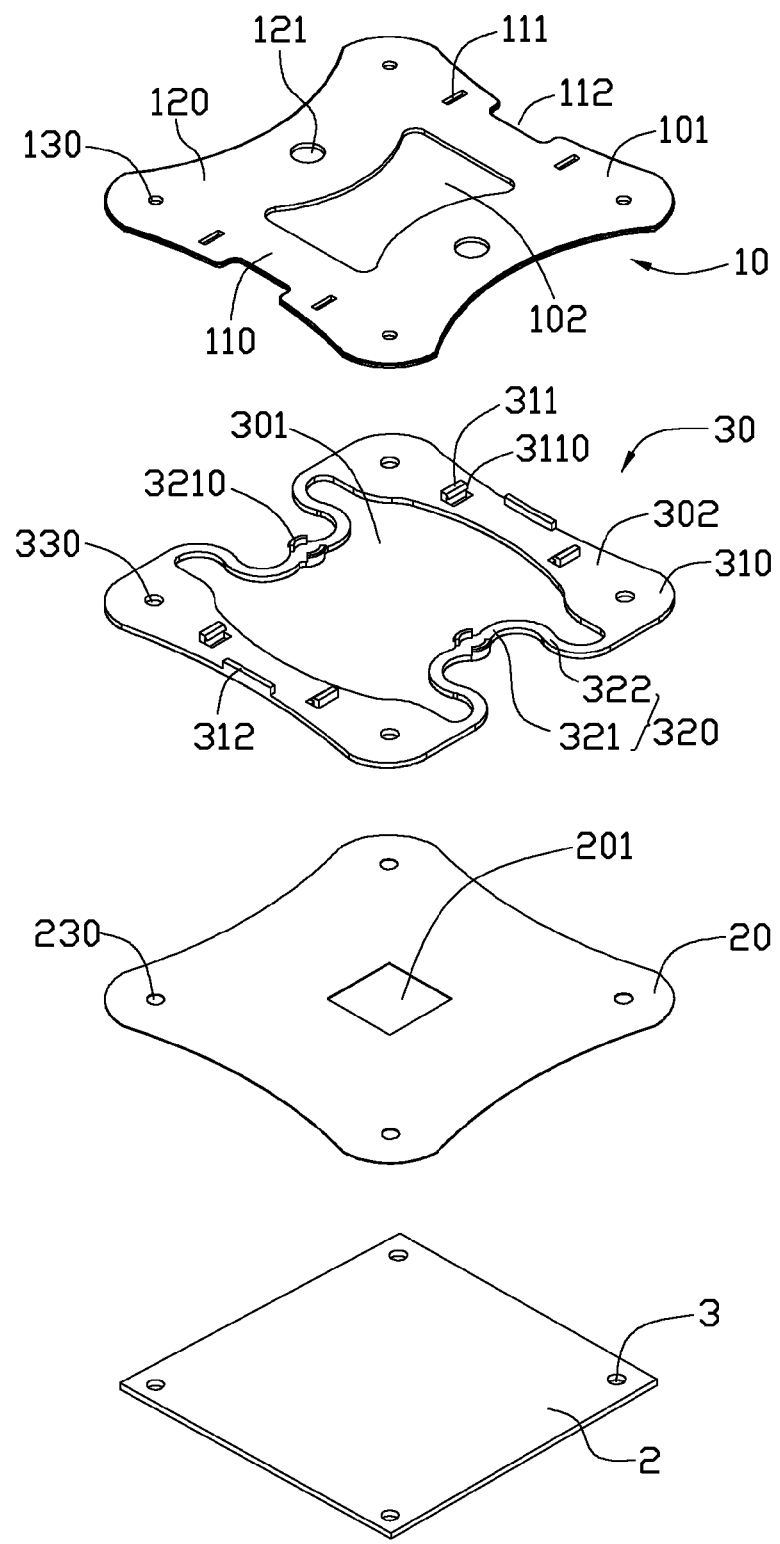
FIG. 2 is an isometric, exploded view of the electronic device of FIG. 1.

Referring to FIGS. 1-2 and 5-6, an exemplary backboard assembly comprises a rigid back plate 10, an electrically insulative sheet 20 and an elastic connection element 30 sandwiched between the back plate 10 and the electrically insulative sheet 20. The backboard assembly is configured for supporting a printed circuit board 2 with an electronic element 1 mounted thereon.

The back plate 10 includes a square metallic base plate 101 defining an opening 102 in a central portion thereof. The base plate 101 includes two opposite first supporting portions 110 and two opposite second supporting portions 120 to enclose the opening 102. Each of the second supporting portions 120 is interconnected between one of two opposite ends of the two first supporting portions 110. Each of the first supporting portions 110 defines two first clasping holes 111 and a cutout 112. The two first clasping holes 111 are spaced at a certain distance and located at a middle portion of the corresponding first supporting portion 110. The cutout 112 is located between the corresponding two first clasping holes 111, and extends inwardly from an outer edge of the corresponding first supporting portion 110. The cutout 112 is rectangular, and has a length parallel to a length of the corresponding first supporting portion 110. Each first clasping hole 111 is a rectangular hole, and has a length parallel to a width of the corresponding first supporting portion 110. Each of the second supporting portions 120 defines a circular second clasping hole 121 in a middle portion thereof. The base plate 101 defines four first through holes 130 in four corners thereof.

The connection element 30 is made of rubber, plastic or other elastic material, and defines an opening 301 in vertical alignment with the opening 102 of the back plate 10. The connection element 30 includes two opposite first engaging parts 310 and two opposite second engaging parts 320 to enclose the opening 301. Each of the two second engaging parts 320 is essentially a thin, curved band with a generally U-shaped configuration. Each second engaging part 320 includes a bottom section 321 and two lateral sections 322 extending outwardly from two ends of the bottom section 321, respectively. The two lateral sections 322 define an opening facing away from the opening 301 of the connection element 30. The two lateral sections 322 of each two second engaging part 320 connect with the two first engaging parts 310, respectively.

Each of the first engaging parts 310 has a first side to engage with the backboard 10 and an opposite second side to engage with the electrically insulative sheet 20. Each first engaging part 310 comprises two rectangular first clasps 311 and a block 312 protruding from the first side thereof. The first engaging part 310 defines two separated rectangular through holes 3110. There are two opposite longer edges and two opposite shorter edges cooperatively defining each of the through holes 3110.

Figure 3:
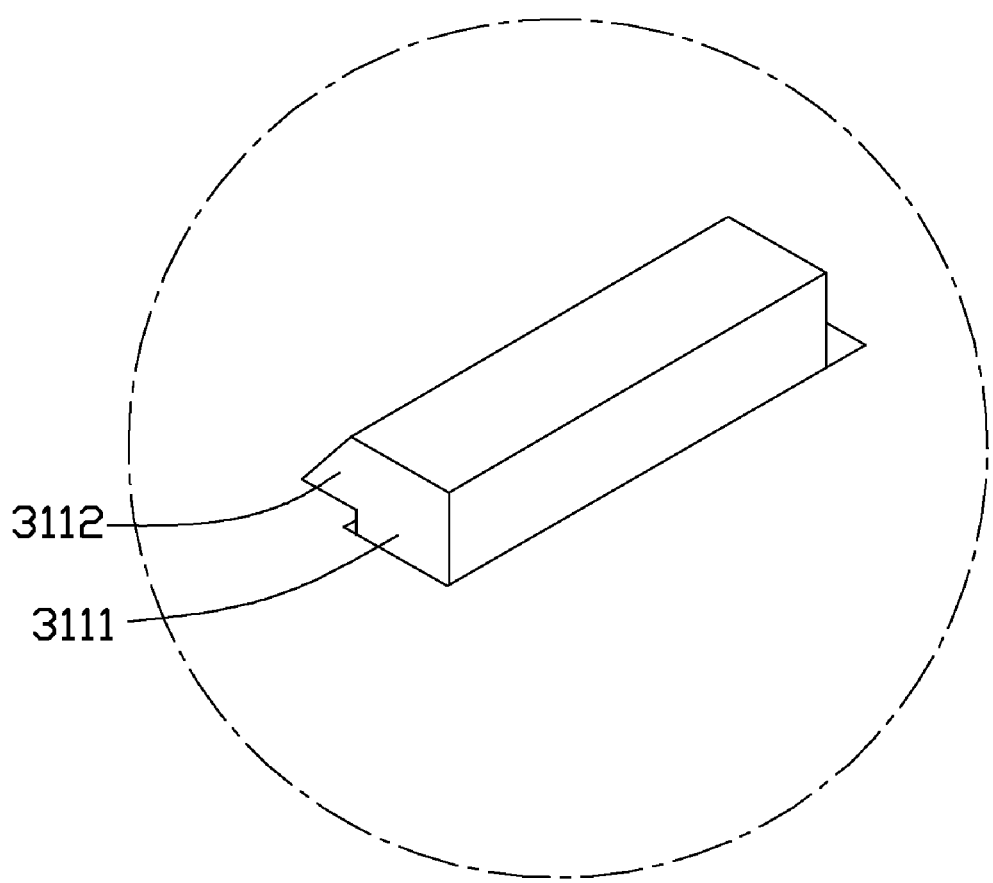
FIG. 3 is an enlarged view of a circled portion III of FIG. 1.

Referring also to FIG. 3, each of the two first clasps 311 includes a rectangular extension part 3111 extending upwardly from an outer longer edge defining the corresponding through hole 3110, and a clasping flange 3112 extending inwardly from a free, top end of the extension part 3111. That is, the two first clasps 311 connect to the two opposite outer longer edges defining the two through holes 3110. Thus the two clasping flanges 3112 of the two first clasps 311 face each other, and are positioned between the two extension parts 3111 of the two first clasps 311. The block 312 protrudes upwardly from an outer edge of the first side of the first engaging part 310. The block 312 is positioned generally between the two first clasps 311. The two blocks 312 of the two first engaging parts 310 of the connection element 30 correspond to the two cutouts 112 of the two first supporting portions 110 of the backboard 10. The four first clasps 311 of the two first engaging parts 310 of the connection element 30 clasp in the four first clasping holes 111 of the two first supporting portions 110 of the backboard 10, respectively. The two blocks 312 of the two first engaging parts 310 of the connection element 30 are located in the two cutouts 112 of the two first supporting portions 110 of the backboard 10, respectively. A height of the extension part 3111 of each of the first clasps 311 is equal to or slightly greater than a thickness of the corresponding first supporting portion 110 of the backboard 10, whereby the clasping flange 3112 of each of the first clasps 311 extends through the corresponding first clasping hole 111 of the first supporting portion 110 of the backboard 10 and fittingly clasps an inner longer edge defining the corresponding first clasping hole 111. In this manner, the two clasping flanges 3112 of the two first clasps 311 of each of the two first engaging parts 310 of the connection element 30 face each other to clasp the two inner edges defining the two corresponding first clasping holes 111 of the first supporting portion 110 of the backboard 10.

A distance between the two first clasps 311 of each of the two first engaging parts 310 of the connection element 30 is slightly less than that between the two first clasping holes 111 of the corresponding first supporting portion 110 of the backboard 10. For example, the difference in the distances is less than about 2-3 millimeters.

Figure 4:
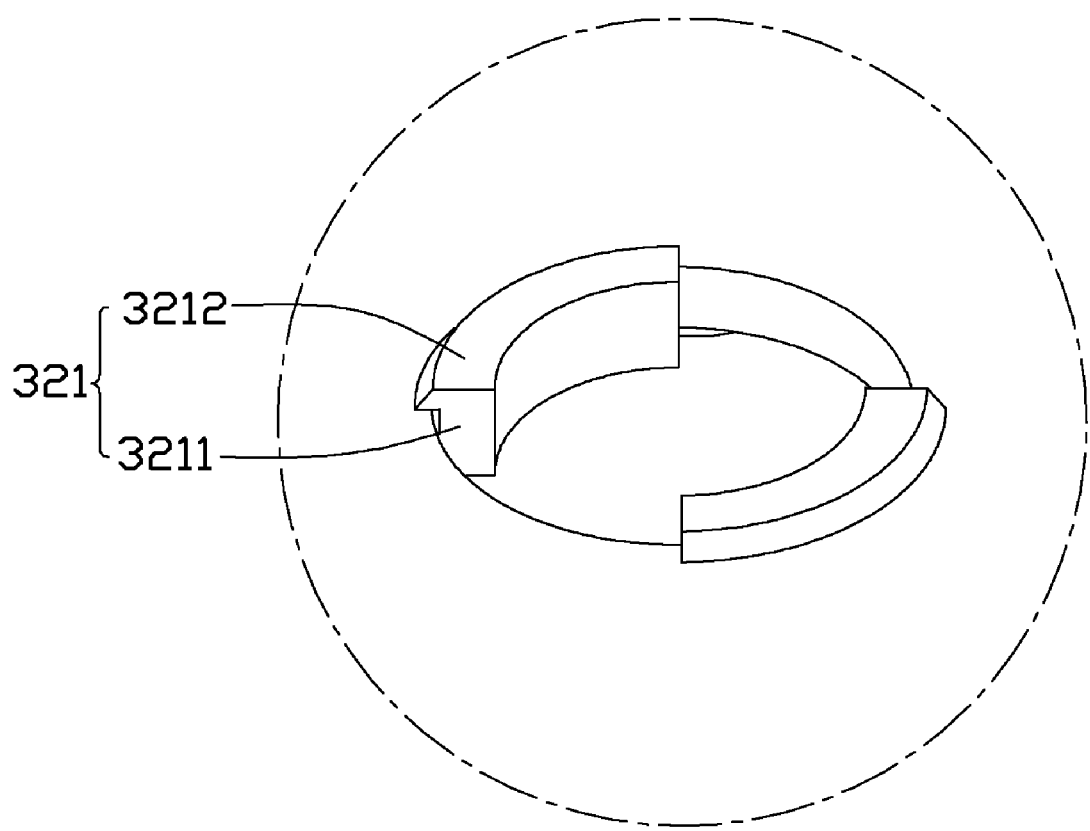
FIG. 4 is an enlarged view of a circled portion IV of FIG. 1.
Figure 5:
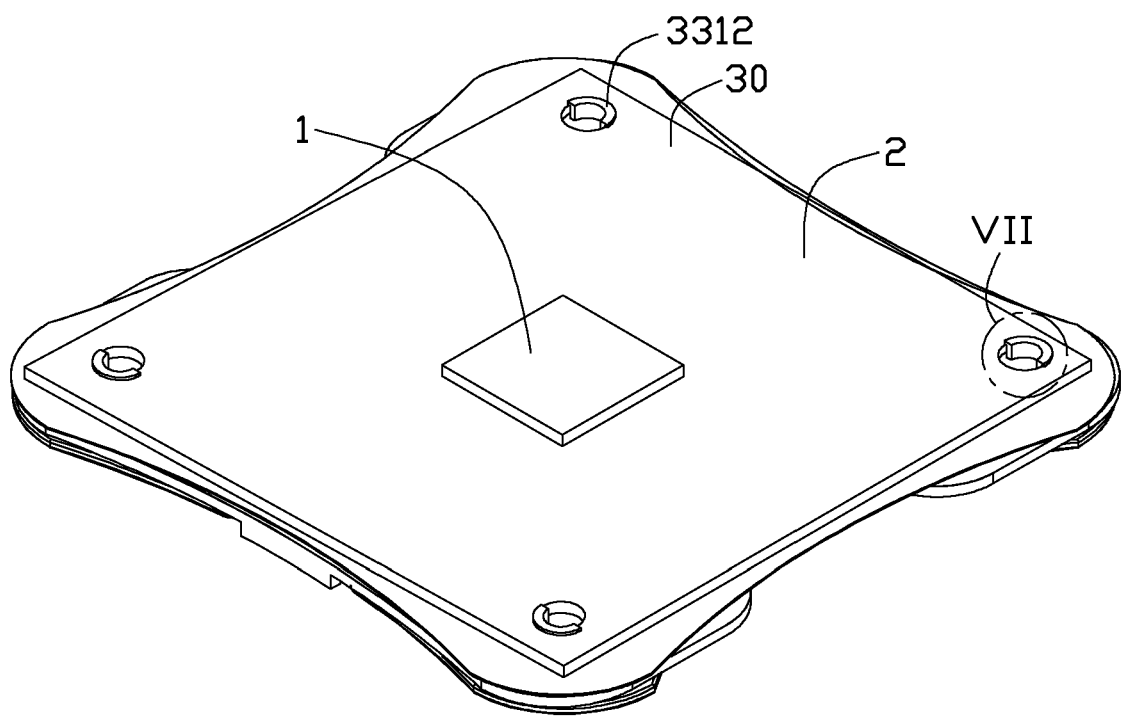
FIG. 5 is an inverted view of FIG. 1.
Figure 6:
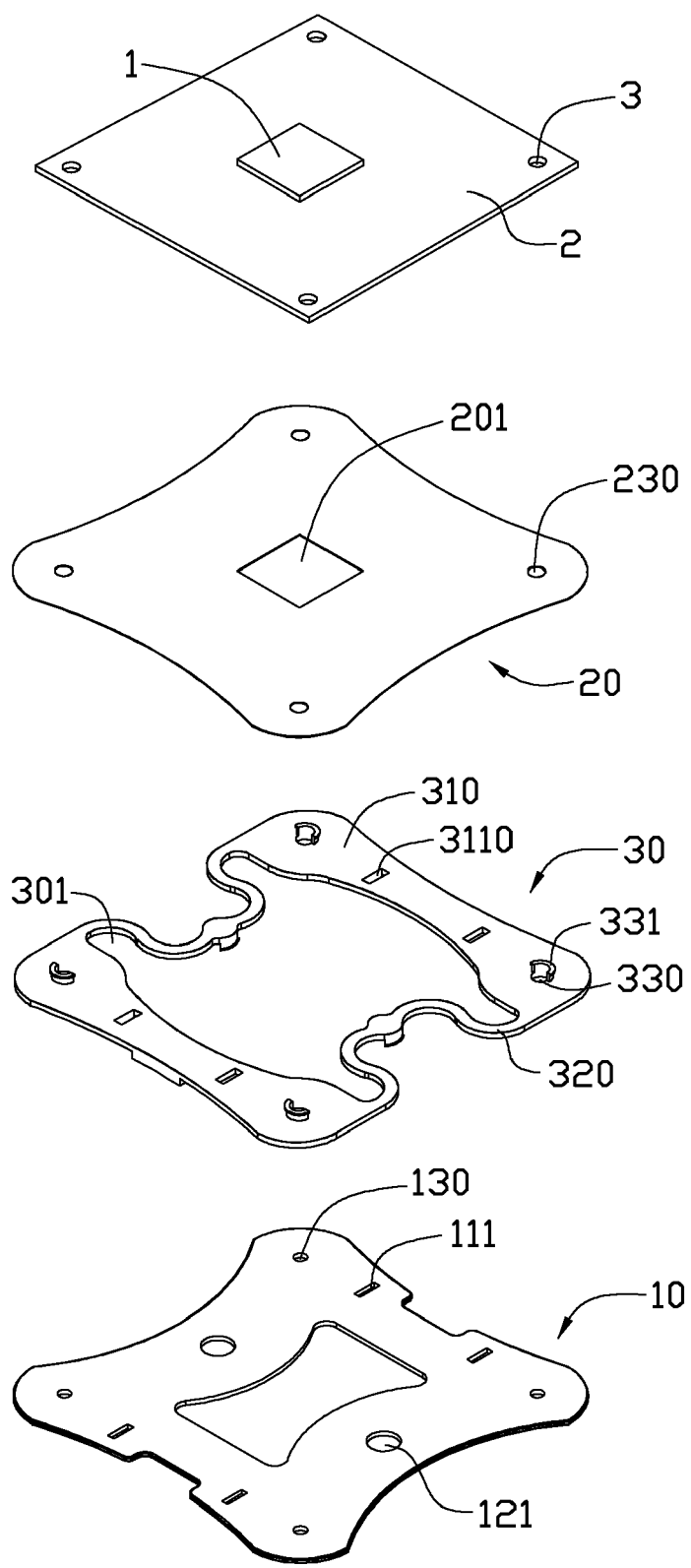
FIG. 6 is an isometric, exploded view of the electronic device shown in FIG. 5.
Figure 7:
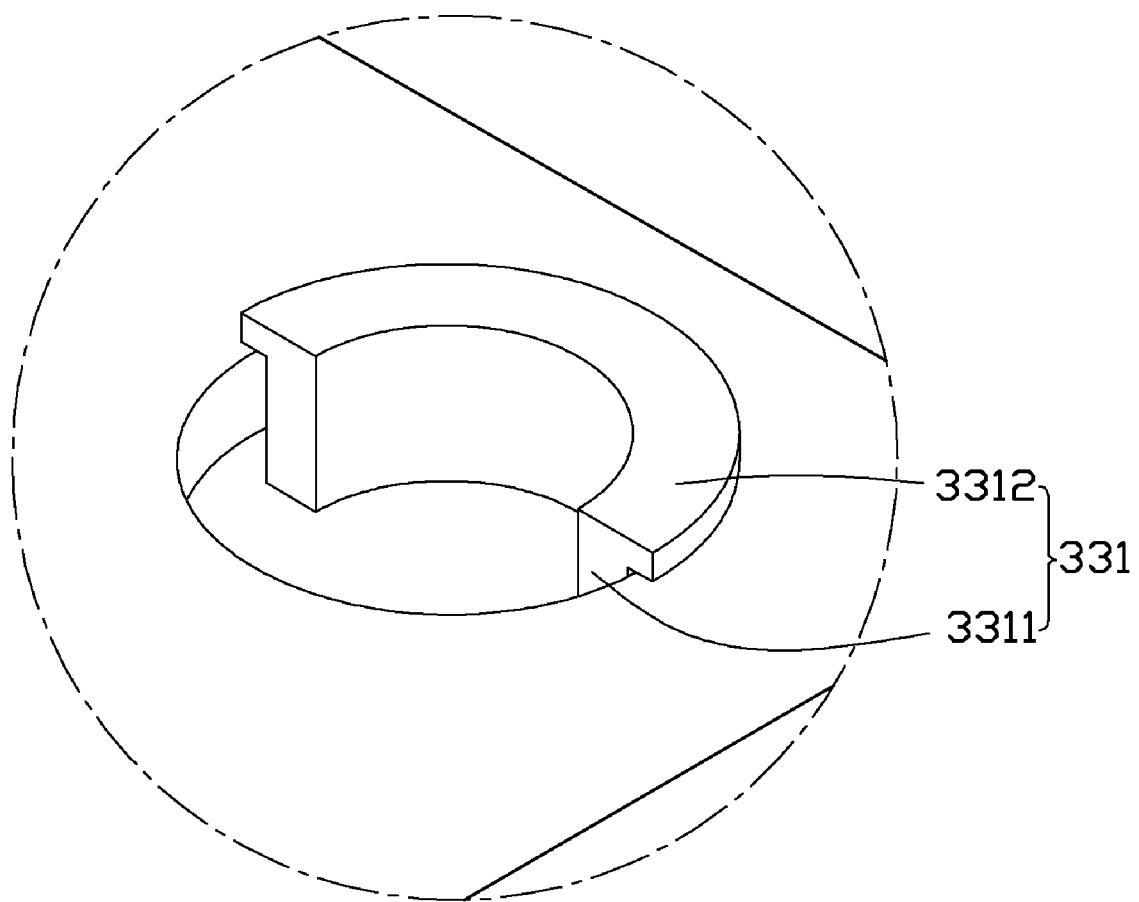
FIG. 7 is an enlarged view of a circled portion VII of FIG. 5.

A second clasp 3210 protrudes from a middle portion of a top surface of the bottom section 321 of each second engaging part 320, and is configured to clasp in the corresponding second clasping hole 121 of the second supporting portion 120 of the backboard 10. Referring also to FIG. 4, each of the second clasps 3210 includes two arc-shaped extension parts 3211 and two flanges 3212 respectively extending outwardly from free, top ends of the two extension parts 3211. The two extension parts 3211 are spaced apart a certain distance and face each other, whereby the two extension parts 3211 cooperatively define an imaginary cylinder. A distance spanned by the two extension parts 3211 of each second clasp 3210, i.e., an outer diameter of the imaginary cylinder, is equal to or slightly less than a diameter of the corresponding second clasping hole 121 of the second supporting portion 120 of the backboard 10. Each second clasp 3210 has certain elasticity. A common height of the two extension parts 3211 of each second clasp 3210 is equal to or slightly greater than a thickness of the second supporting portion 120 of the backboard 10. When the connection element 30 engages with the backboard 10, the two extension parts 3211 of each second clasp 3210 extend through the corresponding second clasping hole 121 of the second supporting portion 120 of the backboard 10, and the two flanges 3212 of each second clasp 3210 resiliently pass through the second clasping hole 121 and clasp two opposite portions of a circular edge defining the second clasping hole 121, respectively.

Referring to FIGS. 2 and 5-7, four corners of the connection element 30 respectively define therein four second through holes 330 spanning between first and second side surfaces (i.e. top and bottom surfaces) of the connection element 30. The four second through holes 330 correspond to the four first through holes 130 of the base plate 101 of the backboard 10, respectively. A third clasp 331 extends downwardly from an edge defining each of the second through holes 330 at the second side surface of the connection element 30. In the present embodiment, each third clasp 331 includes a semi-cylinder shaped extension part 3311 extending downwardly from the second side surface of the connection element 30 and a semi-annular (or semicircular) flange 3312 extending outwardly from a free, bottom end of the extension part 3311. The electrically insulative sheet 20 defines four third through holes 230 at four corners thereof. The printed circuit board 2 defines four fourth through holes 3 corresponding to the four third through holes 230 of the electrically insulative sheet 20, respectively. The four extension parts 3311 of the four third clasps 331 of the connection element 30 sequentially extend through the four third through holes 230 of the electrically insulative sheet 20 and the four fourth through holes 3 of the printed circuit board 2, respectively; and the four flanges 3312 of the four third clasps 331 of the connection element 30 respectively clasp four edges defining the four fourth through holes 3 of the printed circuit board 2. Thereby, the connection element 30, the electrically insulative sheet 20 and the printed circuit board 2 are assembled together.

A distance between the two third clasps 331 of each of the first engaging parts 310 is equal to that between two first through holes 130 of the corresponding first supporting portion 110 of the backboard 10. A distance between two third clasps 331 on same ends of the two first engaging parts 310 is slightly larger than that between the corresponding two first through holes 130 of the backboard 10. Preferably, the difference between the two distances is larger than about 2-3 millimeters. Similarly, the distance between two third clasps 331 on same ends of the two first engaging parts 310 is slightly larger than a distance between the corresponding two third through holes 230 of the electrically insulative sheet 20, and slightly larger than a distance between the corresponding two fourth through holes 3 of the printed circuit board 2. Preferably, each difference between the two respective distances is larger than about 2-3 millimeters. A height of the extension part 3311 of each of the third clasps 331 is equal to or slightly larger than a sum of a thickness of the electrically insulative sheet 20 and a thickness of the printed circuit board 2, whereby the extension part 3311 of the third clasp 331 extends through the corresponding third through hole 230 of the electrically insulative sheet 20 and the corresponding fourth through hole 3 of the printed circuit board 2, and the flange 3312 of the third clasp 331 clasps an edge defining the corresponding fourth through hole 3 of the printed circuit board 2.

In addition, a central portion of the electrically insulative sheet 20 defines an opening 201 corresponding to the opening 102 of the backboard 10 and the opening 301 of the connection element 30. When the electrically insulative sheet 20, the connection element 30 and the backboard 10 are mounted to a top side of the printed circuit board 2 (opposite to the side having the electronic element 1), the openings 201, 301, 102 cooperatively form an airflow passage corresponding to the electronic element 1, thereby facilitating the dissipation of heat generated by the electronic element 1.

In assembling the backboard assembly, the connection element 30 and the backboard 10 are firstly engaged with each other. In detail, the four first clasps 311 and the two second clasps 3210 of the connection element 30 are inserted into the four first clasping holes 111 and the two second clasping holes 121 of the backboard 10. In this assembling process, the two blocks 312 of the connection element 30 are located at the two cutouts 112 of the backboard 10 to thereby prevent the backboard 10 from moving relative to the connection element 30 along a widthwise direction of the first engaging part 310 of the connection element 30. Then, the four third clasps 331 of the connection element 30 extend through the four third through holes 230 of the electrically insulative sheet 20 and the four fourth through holes 3 of the printed circuit board 2. Thereby, the backboard 10, the electrically insulative sheet 20 and the printed circuit board 2 are held together by the connection element 30.

For securely assembling the backboard 10, the electrically insulative sheet 20, the connection element 30 and the printed circuit board 2, four fasteners such as four bolts are extended through the first through holes 130 of the backboard 10, the second through holes 330 of the connection element 30 and the third through holes 230 of the electrically insulative sheet 20, and are engaged in the four fourth through holes 3 of the printed circuit board 2.

It is to be understood, however, that even though numerous characteristics and advantages of the present embodiments have been set forth in the foregoing description, together with details of the configurations and functions of the embodiments, the disclosure is illustrative only, and changes may be made in detail, especially in matters of shape, size, and arrangement of parts within the principles of the embodiments to the full extent indicated by the broad general meaning of the terms in which the appended claims are expressed.

The invention claimed is:

1. A backboard assembly comprising:
a back plate;
an electrically insulative sheet; and
a connection element having a first side and an opposite second side, wherein the connection element comprises a plurality of first engaging structures on the first side thereof to engage with the back plate and a plurality of second engaging structures on the second side to engage with the electrically insulative sheet;
wherein the connection element comprises two opposite first engaging parts and two opposite second engaging parts to enclose a first central opening; the back plate comprises two opposite first supporting portions and two opposite second supporting portions to enclose a second central opening in vertical alignment with the first opening of the connection element; and
wherein the first engaging structures of the connection element comprises two separated first clasps protruding from each of the first engaging parts and located at the first side of the connection element, each of the first supporting portions of the back plate defines two separated first clasping holes, and the two first clasps engage in the corresponding two first clasping holes, respectively.

2. The backboard assembly of claim 1, wherein each first engaging part of the connection element defines two rectangular through holes each defined by two opposite longer edges and two opposite shorter edges, each of the first clasps comprises a rectangular extension part extending upwardly from an outer longer edge defining the corresponding through hole and a clasping flange extending inwardly from a free, top end of the extension part, and each of the first clasping holes is rectangular and corresponds to the corresponding first clasp in structure and size.

3. The backboard assembly of claim 1, wherein the first engaging structures of the connection element further comprises a block protruding from each of the first engaging parts and located at the first side of the connection element, the block is positioned between the two first clasps of the first engaging part, and each of the first supporting portions of the back plate defines a cutout corresponding to the block of the respective first engaging part of the connection element.

4. The backboard assembly of claim 1, wherein a distance between the two first clasps of each of the two first engaging parts of the connection element is about 2 millimeters to about 3 millimeters less than a distance between the two first clasping holes of the corresponding first supporting portion of the backboard.

5. The backboard assembly of claim 1, wherein the second engaging structures of the connection element comprise a second clasp protruding from each of the second engaging parts and located at the first side of the connection element, and each of the second supporting portions of the back plate defines a second clasping hole corresponding to the second clasp of the respective second engaging part of the connection element.

6. The backboard assembly of claim 3, wherein the second clasp comprises two arc-shaped extension parts and two flanges respectively extending outwardly from free, top ends of the two extension parts.

7. The backboard assembly of claim 3, wherein the second engaging structures of the connection element comprises a plurality of third clasps protruding from the second side of the connection element, and the electrically insulative sheet defines a plurality of through holes corresponding to the third clasps, respectively.

8. The backboard assembly of claim 5, wherein each of the third clasps comprises a semi-cylinder shaped extension part extending downwardly from the second side of the connection element and a semicircular flange extending outwardly from a free, bottom end of the extension part.

9. A backboard assembly comprising:
a back plate;
an electrically insulative sheet; and
a connection element having a first side and an opposite second side, wherein the connection element comprises a plurality of first engaging structures on the first side thereof to engage with the back plate and a plurality of second engaging structures on the second side to engage with the electrically insulative sheet;
wherein the connection element comprises two opposite first engaging parts and two opposite second engaging parts to enclose a first central opening; the back plate comprises two opposite first supporting portions and two opposite second supporting portions to enclose a second central opening in vertical alignment with the first opening of the connection element; and
wherein the second engaging structures of the connection element comprise a second clasp protruding from each of the second engaging parts and located at the first side of the connection element, and each of the second supporting portions of the back plate defines a second clasping hole corresponding to the second clasp of the respective second engaging part of the connection element.

* * * * *